(12) United States Patent
Imai

(10) Patent No.: US 12,176,861 B2
(45) Date of Patent: *Dec. 24, 2024

(54) POWER AMPLIFIER CIRCUIT

(71) Applicant: Murata Manufacturing Co., Ltd., Kyoto (JP)

(72) Inventor: Shohei Imai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/506,246

(22) Filed: Nov. 10, 2023

(65) Prior Publication Data

US 2024/0079999 A1   Mar. 7, 2024

Related U.S. Application Data

(63) Continuation of application No. 17/339,539, filed on Jun. 4, 2021, now Pat. No. 11,824,501.

(30) Foreign Application Priority Data

Jun. 5, 2020  (JP) ................. 2020-098348

(51) Int. Cl.
*H03F 1/07* (2006.01)
*H03F 1/02* (2006.01)
*H03F 3/45* (2006.01)

(52) U.S. Cl.
CPC ....... *H03F 1/0288* (2013.01); *H03F 3/45475* (2013.01); *H03F 2200/451* (2013.01)

(58) Field of Classification Search
CPC .................................... H03F 1/02; H03F 1/07
(Continued)

(56) References Cited

U.S. PATENT DOCUMENTS 7,847,630 B2 * 12/2010 Okubo ................. H03F 1/0288
                                                                330/84
8,022,768 B1    9/2011 Bowles et al.
(Continued)

FOREIGN PATENT DOCUMENTS

CN    108462477 A    8/2018
JP    2013-055578 A  3/2013
(Continued)

OTHER PUBLICATIONS

Ercan Kaymaksüt and Patrick Reynaert, "A 2.4 GHz Fully Integrated Doherty Power Amplifier Using Series Combining Transformer," Proceedings of ESSCIRC, 2010, pp. 302-305, Katholieke Universiteit Leuven, Leuven, Belgium.

*Primary Examiner* — Henry Choe
(74) *Attorney, Agent, or Firm* — Pearne & Gordon LLP

(57) ABSTRACT

A power amplifier circuit includes a first amplifier that, in a region where an input signal level is a first level or higher, amplifies a signal split from an input signal and outputs an amplified signal; a first converter connected to an output side of the first amplifier and converts an impedance on the output side of the first amplifier; and at least one or more second amplifiers that, in a region where the input signal level is a second level or higher, amplify a signal split from the input signal and output an amplified signal. Output sides of the second amplifiers are connected in series with an output side of the first converter.

6 Claims, 8 Drawing Sheets

(58) Field of Classification Search
USPC .............................................. 330/295, 124 R
See application file for complete search history.

(56) References Cited

U.S. PATENT DOCUMENTS

| | | | |
|---|---|---|---|
| 8,674,764 B2* | 3/2014 | Kondo | H03F 3/245 330/252 |
| 2008/0007331 A1* | 1/2008 | Suzuki | H03F 1/0288 330/124 R |
| 2013/0057343 A1 | 3/2013 | Kondo | |
| 2014/0159808 A1 | 6/2014 | Acimovic et al. | |
| 2015/0070242 A1 | 3/2015 | Kawai | |
| 2018/0241362 A1 | 8/2018 | Takenaka | |
| 2018/0278214 A1 | 9/2018 | Jin et al. | |

FOREIGN PATENT DOCUMENTS

| | | |
|---|---|---|
| JP | 2015-056756 A | 3/2015 |
| JP | 2018117233 A | 7/2018 |
| JP | 2018-137566 A | 8/2018 |

* cited by examiner

POWER AMPLIFIER CIRCUIT

CROSS REFERENCE TO RELATED APPLICATION

This is a continuation of U.S. application Ser. No. 17/339,539 filed Jun. 4, 2021, which claims priority from Japanese Patent Application No. 2020-098348 filed on Jun. 5, 2020. The contents of these applications are incorporated herein by reference in their entireties.

BACKGROUND

The present disclosure relates to a power amplifier circuit.

A Doherty amplifier is a high-efficiency power amplifier. In a typical Doherty amplifier, a carrier amplifier that operates regardless of the power level of an input signal is connected in parallel with a peaking amplifier that is turned off when the power level of the input signal is low and that is turned on when the power level is high. When the power level of an input signal is high, the carrier amplifier operates at a saturation output power level while being kept in saturation. In other words, in a back-off state in which only the carrier amplifier is performing an amplification operation, only the carrier amplifier operates, and the peaking amplifier does not consume unnecessary current, thereby increasing efficiency. Furthermore, there is a load modulation effect in which, in an input power range from the minimum power at which the peaking amplifier operates to the power at which the peaking amplifier reaches saturation, the impedance of the carrier amplifier is reduced typically by half. Note that load modulation in the present disclosure refers to a reduction in load impedance of the carrier amplifier associated with an increase in output power of the peaking amplifier. When the peaking amplifier and the carrier amplifier are of the same size, a reduction in load impedance of the carrier amplifier by half is regarded as ideal. The saturation output power of the carrier amplifier has the property of being inversely proportional to the load impedance thereof, and thus the load modulation effect causes the saturation power of the carrier amplifier to increase as the output power of the peaking amplifier increases. In other words, in a power range in which the peaking amplifier is operating, the carrier amplifier is operating near saturation power all the time, and it can be said that the carrier amplifier is operating with high efficiency. That is to say, the load modulation effect is important for achieving high-efficiency operation of the Doherty amplifier.

In the Doherty amplifier, a combiner is necessary that combines an output of the carrier amplifier and an output of the peaking amplifier. In the combiner, although a quarter-wave line is used, the quarter-wave line is unsuitable for achieving miniaturization and wideband characteristics. Thus, a Doherty amplifier that does not use a quarter-wave line is disclosed (for example, see Ercan Kaymaksüt, Patrick Reynaert, "A 2.4 GHz fully integrated Doherty power amplifier using series combining transformer", Proceedings of ESSCIRC, pp. 302-305, 2010).

A Doherty amplifier disclosed in Ercan Kaymaksüt, Patrick Reynaert, "A 2.4 GHz fully integrated Doherty power amplifier using series combining transformer", Proceedings of ESSCIRC, pp. 302-305, 2010 is constructed without necessarily using a quarter-wave line and with two transformers. Thus, the miniaturization and wideband characteristics of the Doherty amplifier can be achieved. However, in a configuration of the Doherty amplifier disclosed in Ercan Kaymaksüt, Patrick Reynaert, "A 2.4 GHz fully integrated Doherty power amplifier using series combining transformer", Proceedings of ESSCIRC, pp. 302-305, 2010, there is a possibility that the load modulation effect may not be able to be achieved in which the load of a carrier amplifier is reduced by half at the time of a transition from a back-off state to a saturation state. Consequently, there is a possibility that efficiency may not be able to be increased by the Doherty amplifier disclosed in Ercan Kaymaksüt, Patrick Reynaert, "A 2.4 GHz fully integrated Doherty power amplifier using series combining transformer", Proceedings of ESSCIRC, pp. 302-305, 2010.

BRIEF SUMMARY

Thus, the present disclosure provides a power amplifier circuit in which a Doherty amplifier produces an appropriate load modulation effect without necessarily using a quarter-wave line.

A power amplifier circuit according to one aspect of the present disclosure includes a first amplifier configured to, in a region where a power level of an input signal is not less than a first level, amplify a first signal split from the input signal and output a second signal; a first converter connected to an output side of the first amplifier and configured to convert an impedance on the output side of the first amplifier; and at least one or more second amplifiers configured to, in a region where the power level of the input signal is not less than a second level higher than the first level, amplify a third signal split from the input signal and output a fourth signal. Output sides of the respective second amplifiers are connected in series with an output side of the first converter.

A power amplifier circuit according to one aspect of the present disclosure includes a third amplifier configured to, in a region where a power level of an input signal is not less than a third level, amplify a fifth signal split from the input signal and output a sixth signal; a third converter connected to an output side of the third amplifier and configured to convert an impedance on the output side of the third amplifier; and at least one or more fourth amplifiers configured to, in a region where the power level of the input signal is not less than a fourth level higher than the third level, amplify a seventh signal split from the input signal and output an eighth signal. Output sides of the respective fourth amplifiers are connected in parallel with an output side of the third converter.

A power amplifier circuit according to one aspect of the present disclosure includes a fifth amplifier configured to, in a region where a power level of an input signal is not less than a fifth level, amplify a ninth signal split from the input signal and output a tenth signal; at least one or more sixth amplifiers configured to, in a region where the power level of the input signal is not less than a sixth level higher than the fifth level, amplify an eleventh signal split from the input signal and output a twelfth signal; and fifth converters connected to output sides of the respective sixth amplifiers and configured to convert impedances on the output sides of the respective sixth amplifiers. Output sides of the respective fifth converters are connected in series with an output side of the fifth amplifier.

The present disclosure can provide the power amplifier circuit in which a Doherty amplifier produces an appropriate load modulation effect without necessarily using a quarter-wave line.

Other features, elements, characteristics and advantages of the present disclosure will become more apparent from the following detailed description of embodiments of the present disclosure with reference to the attached drawings.

DETAILED DESCRIPTION

Figure 1:
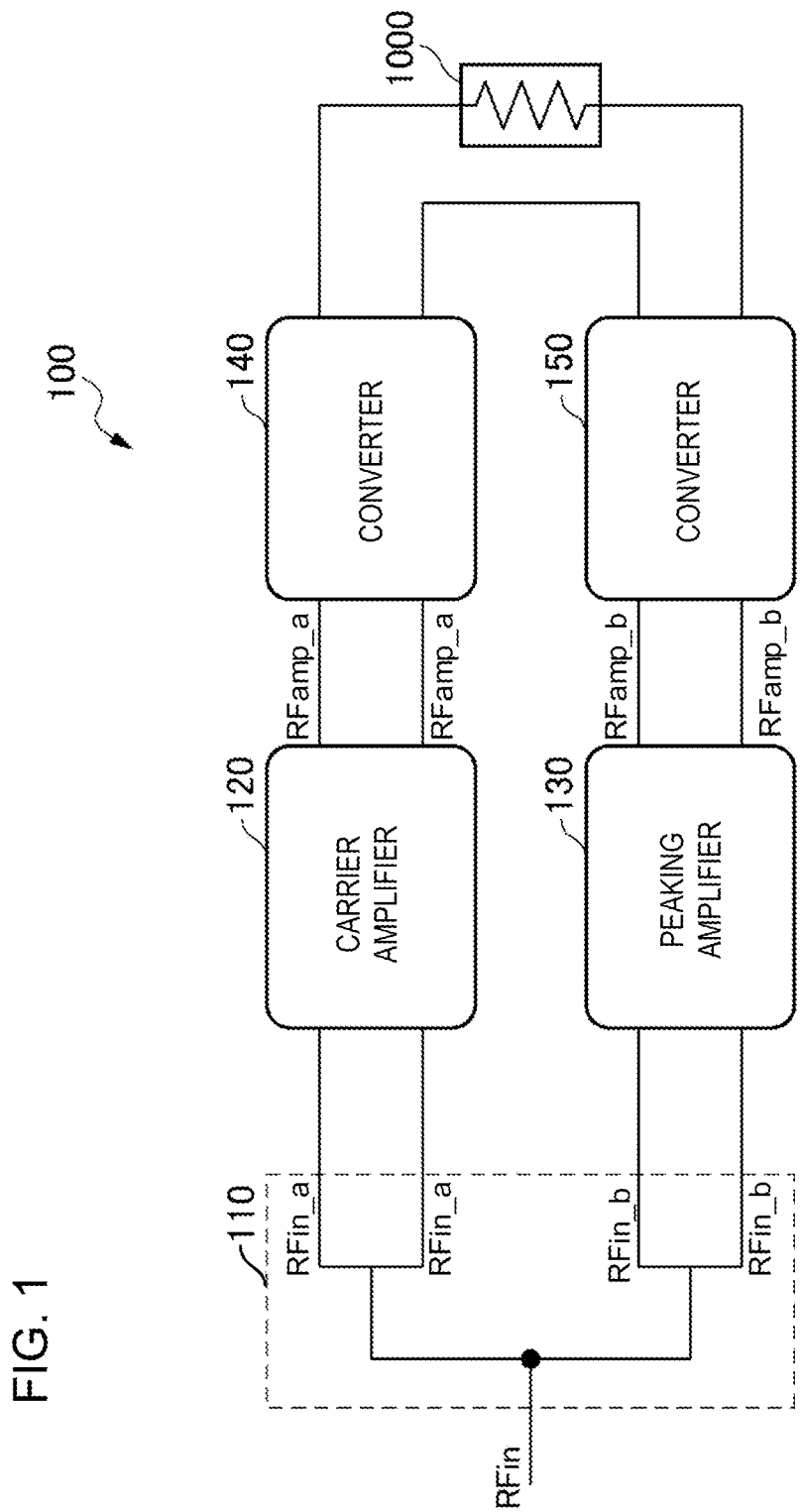
FIG. 1 is a configuration diagram illustrating a schematic configuration of a power amplifier circuit according to a first embodiment.

Embodiments of the present disclosure will be described below with reference to the drawings. Here, circuit elements denoted by the same reference numerals refer to the same circuit element, and repeated descriptions of the circuit elements are omitted.

Configuration of Power Amplifier Circuit 100 According to First Embodiment

Figure 2:
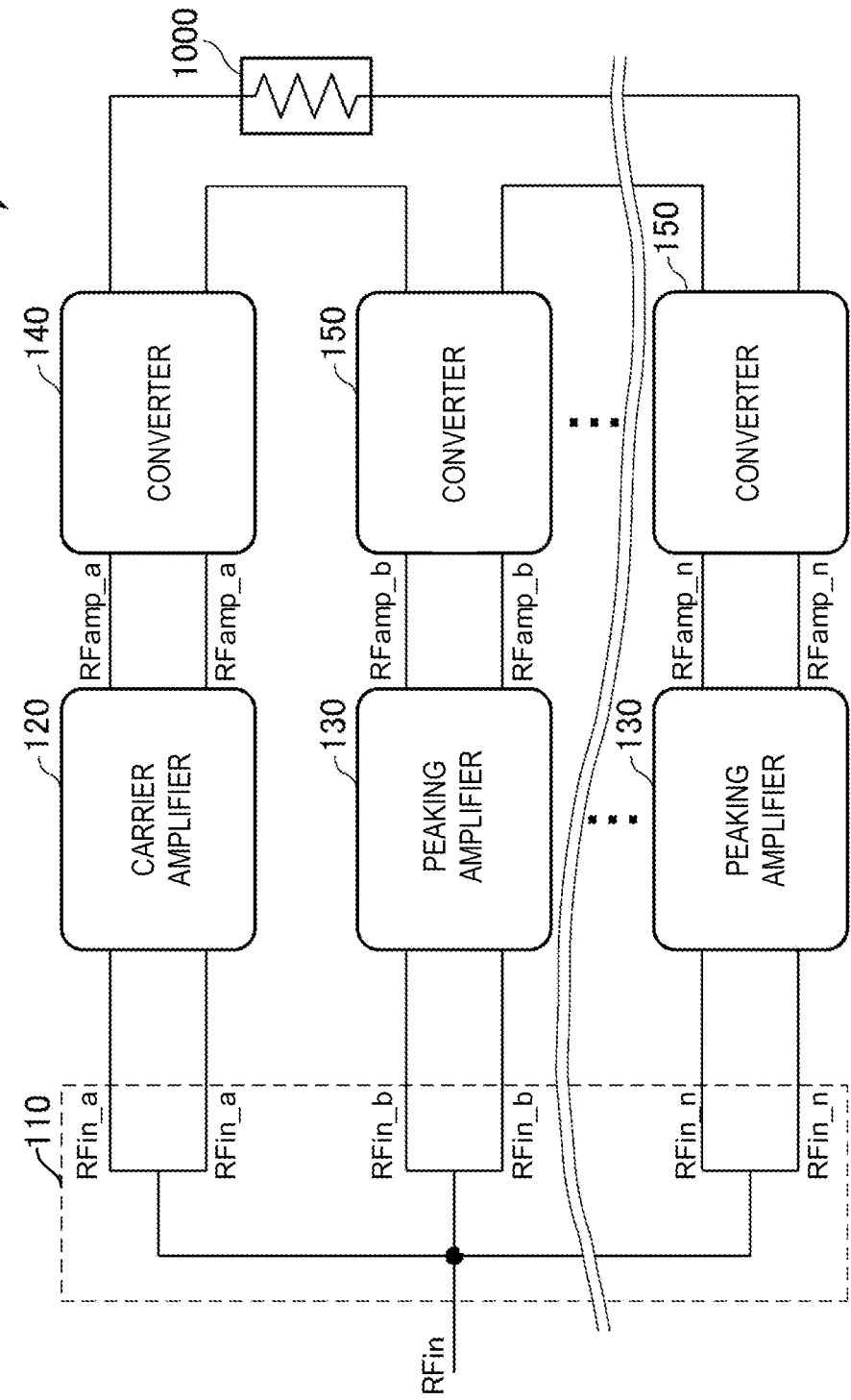
FIG. 2 is a configuration diagram illustrating a modification of the power amplifier circuit according to the first embodiment.
Figure 3:
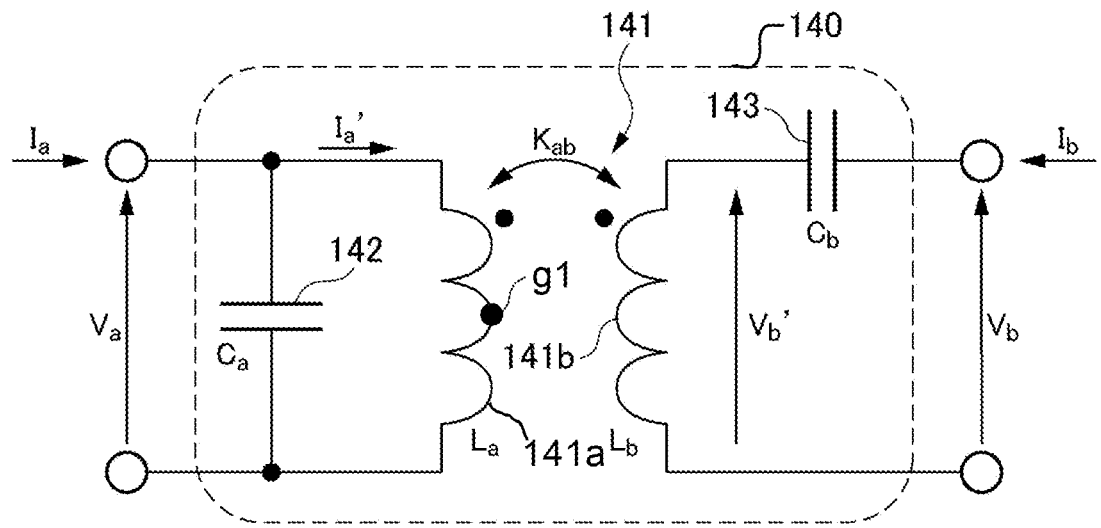
FIG. 3 is a configuration diagram illustrating an example of a converter that can be regarded as a current source.
Figure 4:
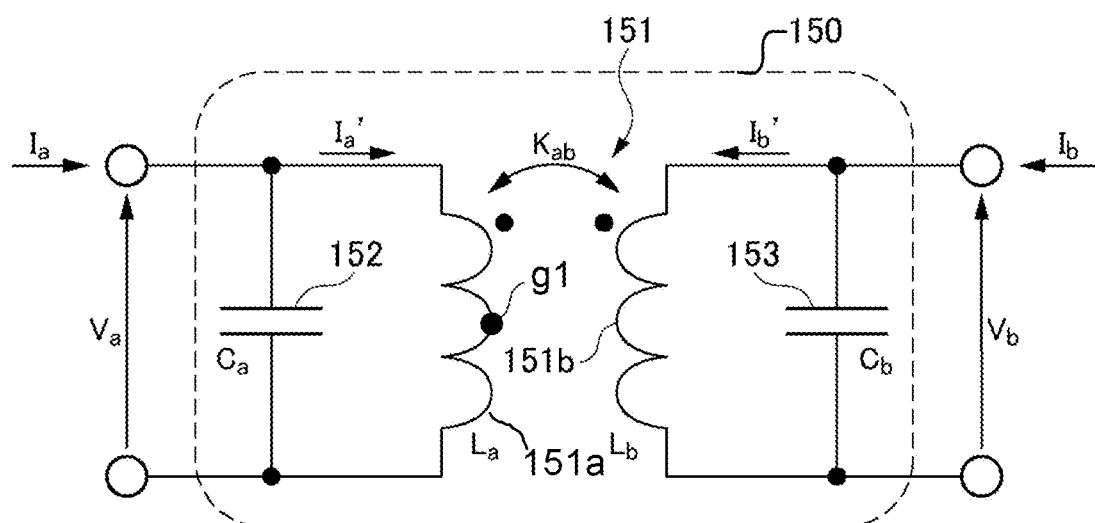
FIG. 4 is a configuration diagram illustrating an example of a converter that can be regarded as a voltage source.
Figure 5:
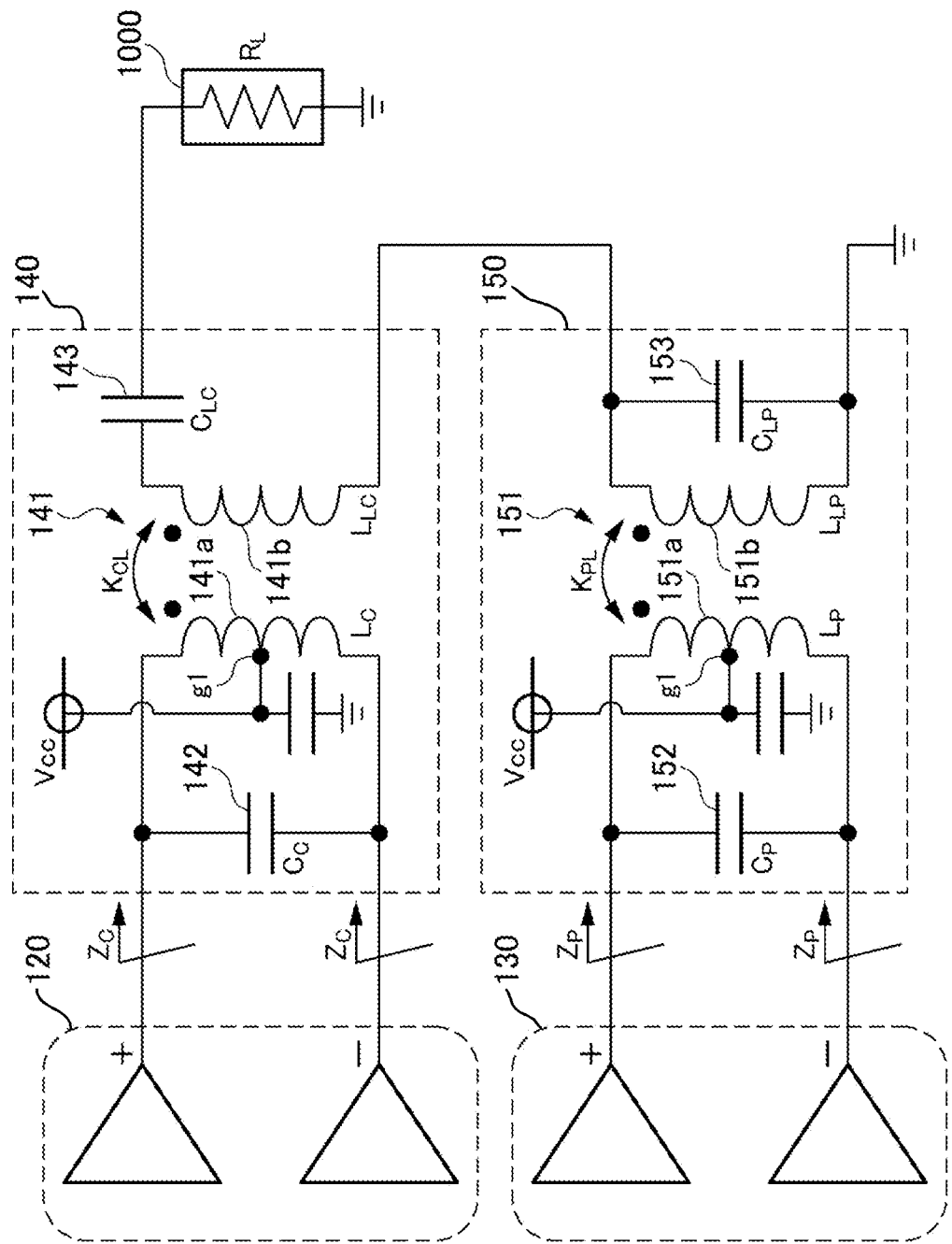
FIG. 5 is a configuration diagram illustrating an example of a configuration of the power amplifier circuit according to the first embodiment.

A configuration of a power amplifier circuit 100 according to a first embodiment will be described with reference to FIGS. 1 to 5. FIG. 1 is a configuration diagram illustrating a schematic configuration of the power amplifier circuit 100 according to the first embodiment. FIG. 2 is a configuration diagram illustrating a modification of the power amplifier circuit 100 according to the first embodiment. FIG. 3 is a configuration diagram illustrating an example of a converter 140 that can be regarded as a current source. FIG. 4 is a configuration diagram illustrating an example of a converter 150 that can be regarded as a voltage source. FIG. 5 is a configuration diagram illustrating an example of a configuration of the power amplifier circuit 100 according to the first embodiment.

The power amplifier circuit 100 is incorporated, for example, in a cellular phone and is used to amplify power of a signal to be transmitted to a base station. The power amplifier circuit 100 can amplify power of signals of communication standards, such as the second generation mobile communication system (2G), the third generation mobile communication system (3G), the fourth generation mobile communication system (4G), the fifth generation mobile communication system (5G), long term evolution (LTE)-frequency division duplex (FDD), LTE-time division duplex (TDD), LTE-Advanced, and LTE-Advanced Pro. The communication standard of a signal to be amplified by the power amplifier circuit 100 is not limited to these.

The power amplifier circuit 100 amplifies an input signal RFin and outputs an output signal RFout. An input signal is a radio-frequency (RF) signal, and the frequency of the input signal is, for example, about several GHz.

As illustrated in FIG. 1, the power amplifier circuit 100 includes, for example, a splitter 110, a carrier amplifier 120, a peaking amplifier 130, the converter 140, and the converter 150. Each component will be described below.

The splitter 110 splits an incoming input signal RFin, for example, into a signal RFin_a (first signal, fifth signal, ninth signal) and a signal RFin_b (third signal, seventh signal, eleventh signal) that leads the signal RFin_a by substantially 90 degrees. In this embodiment, the carrier amplifier 120 and the peaking amplifier 130 are differential amplifiers as described later, and thus each of the signals RFin_a and RFin_b is further split into two input signals that differ in phase by about 180 degrees.

The carrier amplifier 120 (first amplifier) amplifies an incoming signal RFin_a and outputs an amplified signal RFamp_a (second signal, sixth signal, tenth signal), for example. Furthermore, the peaking amplifier 130 (second amplifier) amplifies an incoming signal RFin_b and outputs an amplified signal RFamp_b (fourth signal, eighth signal, twelfth signal). In this embodiment, for example, the carrier amplifier 120 is biased so as to operate in class AB, and the peaking amplifier 130 is biased so as to operate in class C.

In other words, the carrier amplifier 120 operates in a region where the power level of the input signal RFin is not less than zero (first level) regardless of the power level. On the other hand, the peaking amplifier 130 operates in a region where a voltage level of the input signal RFin is not less than a level Vback (second level) that is lower than a maximum level Vmax by a certain level. Hereinafter, this is also referred to as back-off. In other words, the peaking amplifier 130 operates in a region where the power level of the input signal RFin is not less than the level (second level) that is lower than the maximum level by the certain level (for example, about 6 dB) and higher than zero (first level). Thus, by combining operations performed by two amplifiers in accordance with the power level of an input signal, a region where the carrier amplifier 120 operates at a saturation output is expanded. Hence, in comparison with a power amplifier circuit including only one amplifier, power efficiency is increased.

The carrier amplifier 120 and the peaking amplifier 130 are differential amplifiers. A differential amplifier includes two amplifier elements forming a pair and amplifies and outputs mainly a potential difference between signals input to the respective two amplifier elements and being equal in amplitude and opposite in phase. Hence, if signals (for example, noise or the like) equal in amplitude and phase are simultaneously input to the respective two amplifier elements, the signals equal in amplitude and phase are cancelled out. In other words, the use of differential amplifiers as the carrier amplifier 120 and the peaking amplifier 130 can keep noise or a harmonic of an input signal from occurring.

Incidentally, an amplifier element included in each differential amplifier is not limited to a particular element. The amplifier element may be, for example, a bipolar transistor, such as a heterojunction bipolar transistor (HBT), or a field-effect transistor, such as a metal-oxide-semiconductor field-effect transistor (MOSFET).

The converter 140 and the converter 150 are respectively connected to output sides of the carrier amplifier 120 and the peaking amplifier 130. For example, the converters 140 and 150 convert characteristics (impedance, phase, and so forth) regarding the respective amplifiers 120 and 130 and also transmit amplified power to a load 1000. The following description will be given assuming that the converter 150 connected to one peaking amplifier 130 is connected in series with the load 1000 as illustrated in FIG. 1. Incidentally, as illustrated in FIG. 2, converters 150 connected to a plurality of peaking amplifiers 130 may be individually connected in series with the load 1000.

The converters 140 and 150 substantially convert characteristics (impedance, phase, and so forth) regarding amplifier elements constituting the respective amplifiers 120 and 130, and thus an adjustment is made as to whether each of the amplifiers 120 and 130 can be regarded as a current source or can be regarded as a voltage source when the amplifiers 120 and 130 are seen from a load 1000 side. Incidentally, a determination is made, in accordance with a relative comparison between absolute values of output impedances of the amplifiers 120 and 130, as to whether each of the amplifiers 120 and 130 can be regarded as a current source or can be regarded as a voltage source. Here, an output impedance may be calculated by using a reflection coefficient obtained from a traveling wave and a reflected wave that are measured from the load 1000 side when a transistor of each of the amplifiers 120 and 130 is biased without necessarily an idle current being caused to flow therethrough.

In the power amplifier circuit 100 according to the first embodiment, the converter 140 and the converter 150 are configured so that a carrier amplifier 120 side can be regarded as a current source by the converter 140 and so that a peaking amplifier 130 side can be regarded as a voltage source by the converter 150. In other words, the converter 140 and the converter 150 are configured to make an absolute value of an impedance on the output side of the carrier amplifier 120 (output side of the converter 140) larger than an absolute value of an impedance on the output side of the peaking amplifier 130 (output side of the converter 150).

Examples of configurations of the converter 140 and the converter 150 will be described below with reference to FIGS. 3 and 4.

As illustrated in FIG. 3, the converter 140 that can be regarded as a current source includes, for example, a first transformer 141, a first capacitor 142, and a second capacitor 143.

The first transformer 141 is, for example, a winding transformer including an input-side winding 141a and an output-side winding 141b. The first transformer 141 propagates a signal input to the input-side winding 141a to the output-side winding 141b. Specifically, in the first transformer 141, the amplified signal RFamp_a (current Ia) output from the carrier amplifier 120 is input to the input-side winding 141a (first input-side winding) and is output from the output-side winding 141b (first output-side winding).

A power supply voltage Vcc is supplied to a midpoint g1 of the input-side winding 141a of the first transformer 141. Here, two input signals opposite in phase are supplied from the carrier amplifier 120 to the midpoint g1, and thus the midpoint g1 is a virtual ground point. Hence, the power supply voltage Vcc is supplied to the midpoint g1, thereby enabling a reduction in noise caused by a power supply circuit. In other words, the power amplifier circuit 100 does not have to include a power supply choke coil or bypass capacitor. This enables a reduction in circuit size.

Incidentally, when a turns ratio between the input-side winding 141a and the output-side winding 141b is adjusted, the first transformer 141 can also have an impedance matching function. Thus, impedance matching can be performed by the first transformer 141 formed on a chip without necessarily an output matching network being formed outside the chip. Hence, the power amplifier circuit 100 can be reduced in circuit size.

The first capacitor 142 is connected in parallel with the input-side winding 141a, for example. The second capacitor 143 is connected directly to the output-side winding 141b, for example. The first capacitor 142 and the second capacitor 143 are provided, for example, for impedance matching performed by the first transformer 141 in the case where the influence of parasitic inductance of the first transformer 141 is taken into account. Incidentally, the first capacitor 142 can be replaced with capacitance parasitic in the carrier amplifier 120 and therefore may be omitted.

As illustrated in FIG. 4, the converter 150 that can be regarded as a voltage source includes, for example, a second transformer 151, a third capacitor 152, and a fourth capacitor 153. Characteristics of the components of the converter 150 are the same as those of the components of the converter 140. In place of the second capacitor 143 of the converter 140, the fourth capacitor 153 is connected in parallel with an output-side winding. Here, for convenience of explanation, a description of the same components as those of the converter 140 is omitted.

As seen from FIGS. 3 and 4 described above, the power amplifier circuit 100 is configured so that an output impedance of the converter 140 as seen from the load 1000 side is larger than an output impedance of the converter 150 as seen from the load 1000 side. Hence, in the power amplifier circuit 100, the converter 140 is relatively regarded as a current source, and the converter 150 is relatively regarded as a voltage source.

In other words, in the power amplifier circuit 100, when the carrier amplifier 120 side can be regarded as a current source and the peaking amplifier 130 side can be regarded as a voltage source, a current that flows into the load 1000 is determined only by the current source. For this reason, in the power amplifier circuit 100, with the transition from a small-signal state to a saturation state in the carrier amplifier 120, output impedances as seen from the amplifier elements of the carrier amplifier 120 can be appropriately reduced by half without necessarily using a quarter-wave line. Hence, a compact and wideband Doherty amplifier can be implemented, and the high efficiency of the Doherty amplifier can also be achieved.

Furthermore, when a differential amplifier is used in the power amplifier circuit 100, a circuit can be implemented that is resistant to power-supply noise. Additionally, a simple bias circuit and a circuit exhibiting excellent linearity can be implemented.

FIG. 1 schematically illustrates the amplifiers 120 and 130 of the power amplifier circuit 100, whereas, in the power amplifier circuit 100, for example, one amplifier may constitute a first stage (driver stage), and the configuration of the above-described Doherty amplifier may be used for an output stage (power stage). Furthermore, in the power amplifier circuit 100, an amplifier serving as the first stage (driver stage) may be connected to each of the carrier amplifier 120 and the peaking amplifier 130 in the output stage (power stage).

An example of how to determine parameters of elements constituting the converter 140 and the converter 150 will be described below with reference to FIGS. 3 to 5. FIG. 5 illustrates an example of a configuration of the power amplifier circuit 100 in which the carrier amplifier 120 and the peaking amplifier 130 are differential pairs and that provides a single-ended output.

As illustrated in FIG. 5, the power amplifier circuit 100 includes, for example, the carrier amplifier 120 composed of a differential pair, the converter 140 connected to the carrier amplifier 120, the peaking amplifier 130 composed of a differential pair, and the converter 150 connected to the peaking amplifier 130.

First, parameters of elements constituting the converter 140 will be described with reference to FIG. 3. In the power amplifier circuit 100, when appropriate parameters of the elements constituting the converter 140 are selected, the converter 140 as seen from the load 1000 side can be regarded as a current source. Specifically, in the converter 140 illustrated in FIG. 3, when parameters are selected to meet conditions of the following Equations (1) and (2), the converter 140 can be regarded as a current source.

$$\omega_0^2 \times L_a \times C_a = 1 \tag{1}$$

$$\omega_0^2 \times L_b \times C_b = 1/(1 - k_{ab}^2) \tag{2}$$

In Equations (1) and (2), $\omega_0$ represents angular frequency ($2\pi f$), $L_a$ represents the inductance of the input-side winding 141a, $L_b$ represents the inductance of the output-side winding 141b, $C_a$ represents the capacitance of the first capacitor 142, $C_b$ represents the capacitance of the second capacitor 143, and $k_{ab}$ represents the coupling coefficient of the first transformer 141.

The above-described conditions are conditions under which a cascade matrix of a circuit represented by the converter 140 illustrated in FIG. 3 is obtained and off-diagonal elements of the cascade matrix are 0. When capacitors and inductors that meet Equations (1) and (2) are selected, the converter 140 illustrated in FIG. 3 performs an operation represented by a cascade matrix represented by Equation (3).

$$\begin{bmatrix} V_a \\ I_a \end{bmatrix} = \begin{bmatrix} \frac{1}{k_{ab}}\sqrt{\frac{L_a}{L_b}} & 0 \\ 0 & k_{ab}\sqrt{\frac{L_b}{L_a}} \end{bmatrix} \begin{bmatrix} V_b \\ -I_b \end{bmatrix} \tag{3}$$

In Equation (3), $V_a$ is an input voltage of the converter 140, $V_b$ is an output voltage of the converter 140, $I_a$ is an input current of the converter 140 corresponding to the amplified signal RFamp_a, and $I_b$ is an output current output from the converter 140 to the load 1000.

The converter 140 having characteristics of the cascade matrix represented by Equation (3) is the circuit that multiplies each of a voltage and a current by a constant to provide an output. In other words, when a current source, such as the carrier amplifier 120, is connected to an input side of the converter 140, the converter 140 can be regarded as a current source when seen from the output side of the converter 140 (load 1000 side).

Next, parameters of elements constituting the converter 150 will be described with reference to FIG. 4. In the power amplifier circuit 100, when appropriate parameters of the elements constituting the converter 150 are selected, the converter 150 as seen from the load 1000 side can be regarded as a voltage source. Specifically, in the converter 150 illustrated in FIG. 4, when parameters are selected to meet conditions of the following Equations (4) and (5), the converter 150 can be regarded as a voltage source.

$$\omega_0^2 \times L_a \times C_a = 1/(1 - k_{ab}^2) \tag{4}$$

$$\omega_0^2 \times L_b \times C_b = 1/(1 - k_{ab}^2) \tag{5}$$

The above-described conditions are conditions under which a cascade matrix of a circuit represented by the converter 150 illustrated in FIG. 4 is obtained and diagonal elements of the cascade matrix are 0. When capacitors and inductors that meet Equations (4) and (5) are selected, the converter 150 illustrated in FIG. 4 performs an operation represented by a cascade matrix represented by Equation (6).

$$\begin{bmatrix} V_a \\ I_a \end{bmatrix} = \begin{bmatrix} 0 & j\frac{(1-k_{ab}^2)\omega_0\sqrt{L_aL_b}}{k_{ab}} \\ j\frac{k_{ab}}{(1-k_{ab}^2)\omega_{0a}\sqrt{L_aL_b}} & 0 \end{bmatrix} \begin{bmatrix} V_b \\ -I_b \end{bmatrix} \tag{6}$$

The converter 150 having characteristics of the cascade matrix represented by Equation (6) is the circuit that interchanges a voltage and a current and multiplies each of the voltage and the current by a constant to provide an output. In other words, when a voltage source, such as the peaking amplifier 130, is connected to an input side of the converter 150, the converter 150 can be regarded as a voltage source when seen from the output side of the converter 150.

Incidentally, the amplifier elements constituting the carrier amplifier 120 and the peaking amplifier 130 and being connected in parallel with capacitors are occasionally illustrated. In this case, the capacitances of the respective capacitors are considered as parts of primary capacitances of the converter 140 and the converter 150, and parameters may be selected.

In conditions for parameters represented by Equations (3) and (6), as illustrated in FIG. 5, the converter 140 is connected to the carrier amplifier 120, and the converter 150 is connected to the peaking amplifier 130. Under such circumstances, an output impedance $Z_C$ as seen from the carrier amplifier 120 is represented by Equation (7), and an output impedance $Z_P$ as seen from the peaking amplifier 130 is represented by Equation (8).

$$2Z_C = R_L \frac{1}{k_{CL}^2} \frac{L_C}{L_{LC}} + j\frac{(1-k_{PL}^2)\omega_0\sqrt{L_PL_{LP}}}{k_{PL}k_{CL}}\sqrt{\frac{L_C}{L_{LC}}}\frac{I_P}{I_C} \tag{7}$$

$$2Z_P = \frac{(1-k_{PL}^2)\omega_0\sqrt{L_PL_{LP}}}{k_{PL}}\frac{1}{k_{CL}}\sqrt{\frac{L_C}{L_{LC}}}\frac{I_P}{I_C} \tag{8}$$

In Equations (7) and (8), $R_L$ represents the impedance of the load 1000, $k_{CL}$ is the coupling coefficient of the first transformer 141, $k_{PL}$ is the coupling coefficient of the second transformer 151, $L_C$ is the inductance of the input-side winding 141a of the converter 140, $L_{LC}$ is the inductance of the output-side winding 141b (load 1000 side) of the converter 140, $L_P$ is the inductance of an input-side winding 151a of the converter 150, $L_{LP}$ is the inductance of an output-side winding 151b (load 1000 side) of the converter 150, $I_C$ is a complex AC current output from the carrier amplifier 120, and $I_P$ is a complex AC current output from the peaking amplifier 130.

Incidentally, assuming that the amplifier elements constituting the carrier amplifier 120 and the peaking amplifier 130 are of the same size, maximum values of current amplitudes are equal, and thus an absolute value of $(I_P/I_C)$ is 1. Furthermore, optimum impedances $R_{OPT}$ of the load 1000 for the amplifier elements of the respective amplifiers 120 and 130 can also be regarded as substantially equal. Hence, when the power amplifier circuit 100 illustrated in FIG. 5 is in saturation, to match the output impedances $Z_C$ and $Z_P$ to an impedance $R_{OPT}$ on the load 1000 side, each element is selected so as to meet conditions of Equation (9) for the first transformer 141 and meet conditions of Equation (10) for the second transformer 151.

$$(1/k_{CL}^2) \times (L_C/L_{LC}) = R_{OPT}/R_L \quad (9)$$

$$(\omega_0^2 \times L_P \times L_{PL}) \times (1 - k_{PL}^2)^2 / k_{PL} \quad (10)$$

More specifically, in a radio-frequency system, the impedance $R_L$ of the load 1000 is about 50Ω. Furthermore, in a mobile communication terminal, such as a cellular phone, power of a maximum of the order of watts (W) has to be output at a power supply voltage of about a few V. Hence, the optimum impedance $R_{OPT}$ of the load 1000 is about a few Ω. Consequently, $R_{OPT}/R_L$ is smaller than 1.

Furthermore, an absolute value of a coupling coefficient of a transformer is smaller than 1, and thus the inductance L c on an input side of the first transformer 141 of the converter 140 is smaller than the inductance $L_{LC}$ on an output side. In other words, the line length of the input-side winding 141a is designed to be shorter than the line length of the output-side winding 141b. Alternatively, the line width of the input-side winding 141a is designed to be thicker than the line width of the output-side winding 141b.

On the other hand, in designing a transformer in a high-frequency region, it is difficult to design inductance while reducing the influence of a parasitic component. Hence, the design of a coupling coefficient is also restricted.

In consideration of these, the coupling coefficient $k_{PL}$ has to be designed from a range of about 0.28 to about 0.99. Furthermore, it is not easy to obtain a coupling coefficient of about 0.99 in the high-frequency region, and thus it is seen that the transformer only has to be designed in consideration of a lower limit of about 0.28 of the coupling coefficient $k_{PL}$ without necessarily considering an upper limit.

Power Amplifier Circuit 200 According to Second Embodiment

Figure 6:
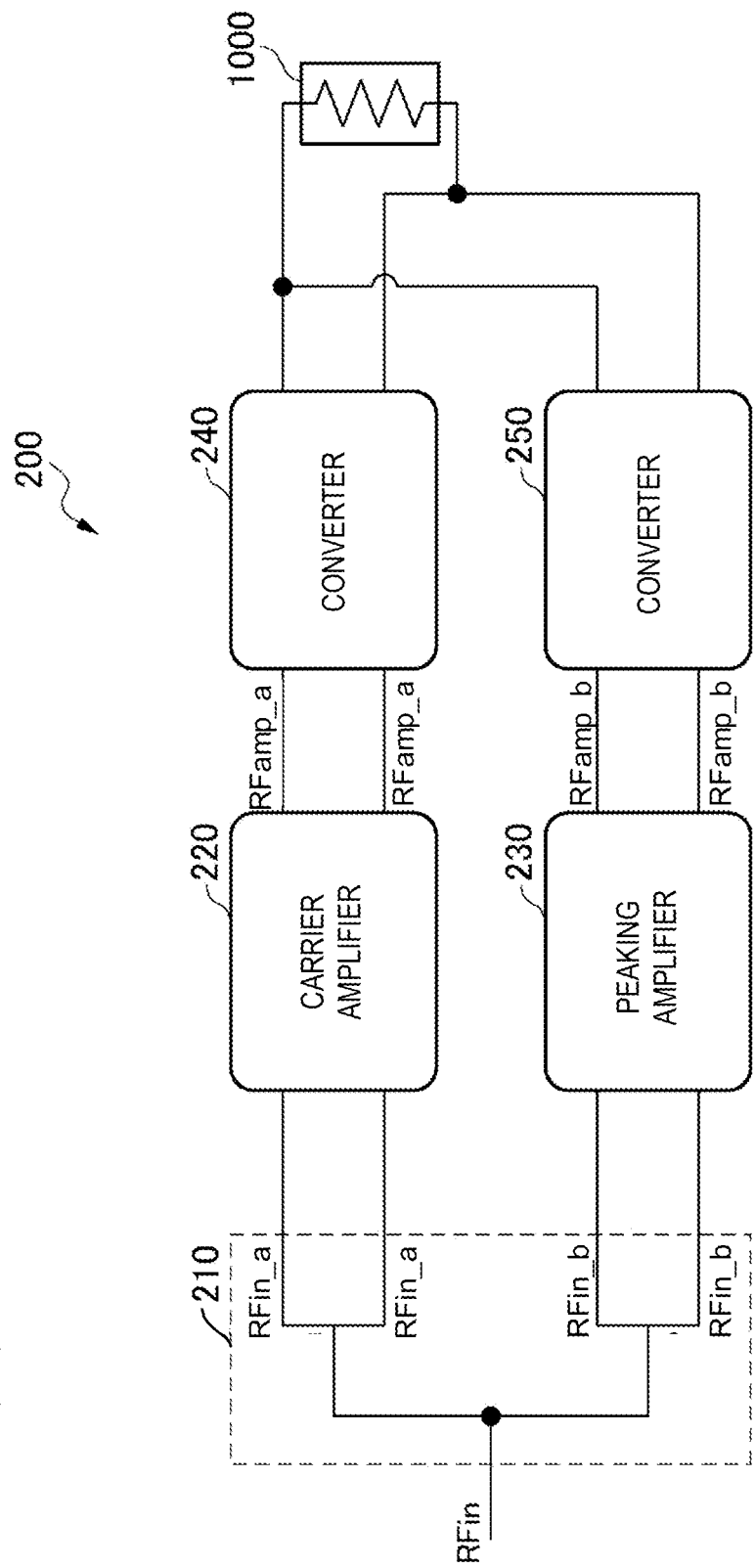
FIG. 6 is a configuration diagram illustrating a schematic configuration of a power amplifier circuit according to a second embodiment.
Figure 7:
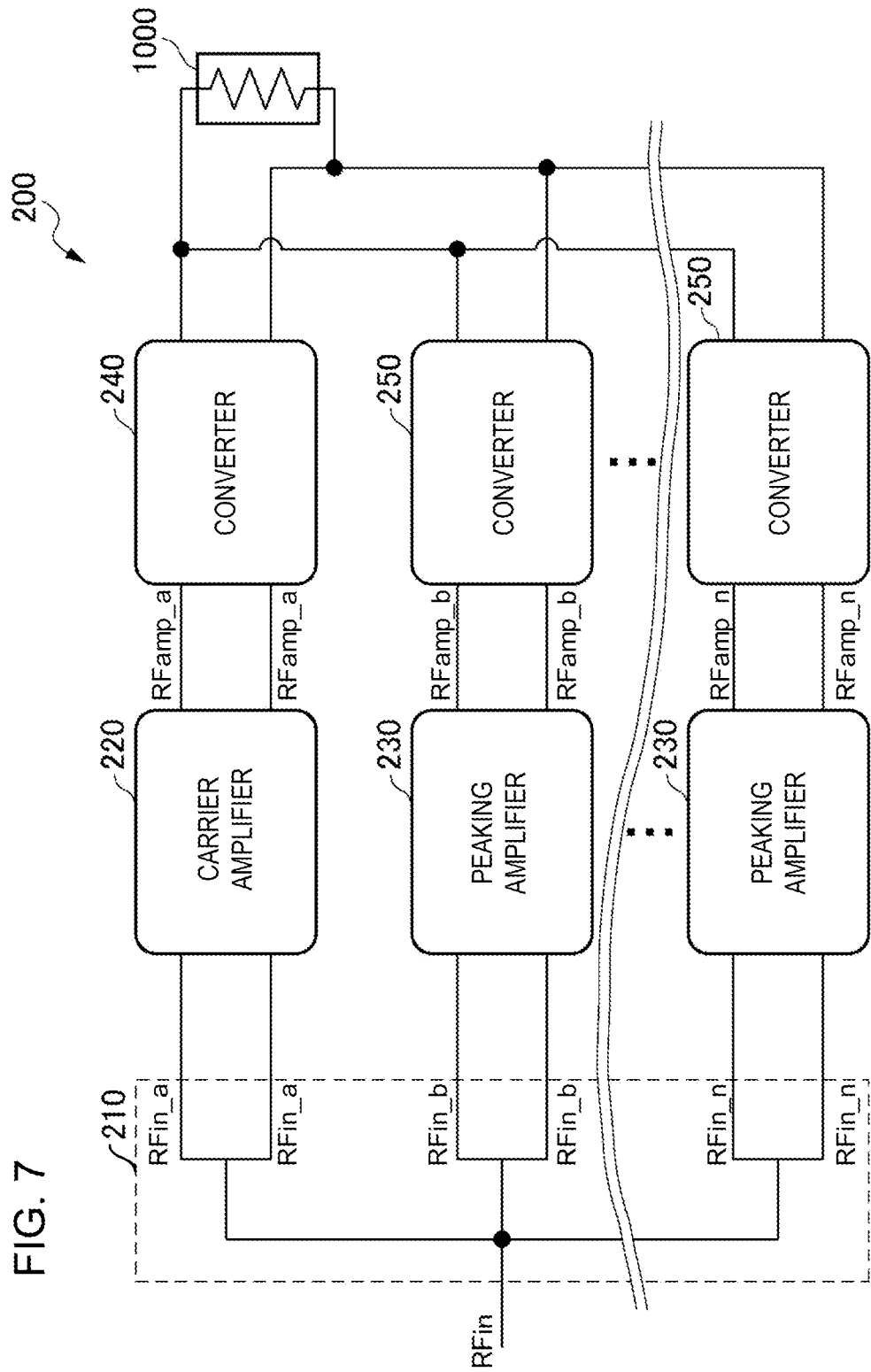
FIG. 7 is a configuration diagram illustrating a modification of the power amplifier circuit according to the second embodiment.
Figure 8:
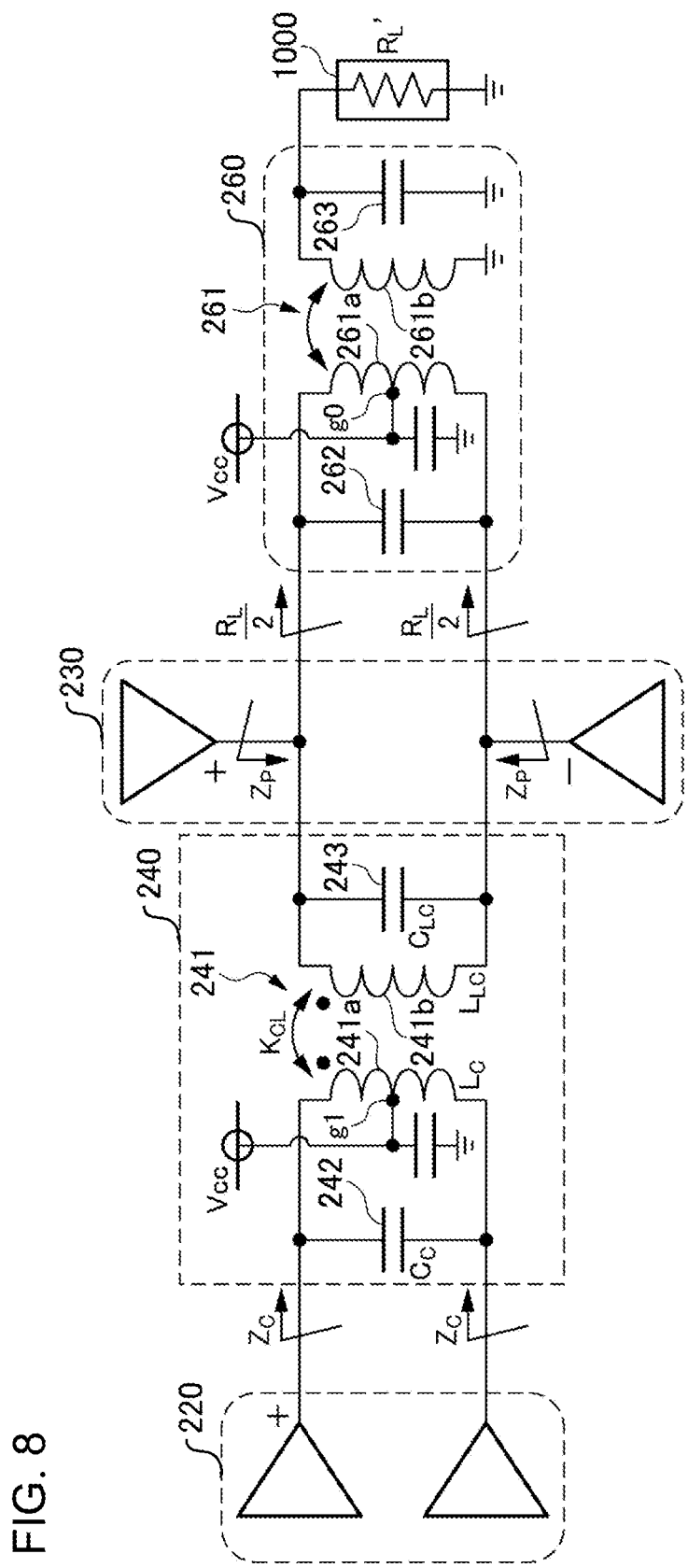
FIG. 8 is a configuration diagram illustrating an example of a configuration of the power amplifier circuit according to the second embodiment.

A power amplifier circuit 200 according to a second embodiment will be described with reference to FIGS. 6 to 8. FIG. 6 is a configuration diagram illustrating a schematic configuration of the power amplifier circuit 200 according to the second embodiment. FIG. 7 is a configuration diagram illustrating a modification of the power amplifier circuit 200 according to the second embodiment. FIG. 8 is a configuration diagram illustrating an example of a configuration of the power amplifier circuit 200 according to the second embodiment. In the power amplifier circuit 200 according to the second embodiment, a description of things in common with the above-described embodiment is omitted, and only respects in which the second embodiment differs from the above-described embodiment will be described. In particular, similar function effects achieved by similar configurations are not described one by one.

As illustrated in FIG. 6, in comparison with the power amplifier circuit 100 according to the first embodiment, in the power amplifier circuit 200, a converter 250 (fourth converter) connected to one peaking amplifier 230 (fourth amplifier) is connected in parallel with the load 1000. Furthermore, as illustrated in FIG. 7, converters 250 connected to a plurality of peaking amplifiers 230 may be individually connected in parallel with the load 1000. Moreover, as illustrated in FIG. 8, a configuration may be employed in which a converter on a peaking amplifier 230 side is removed.

In comparison with the power amplifier circuit 100 according to the first embodiment, in the power amplifier circuit 200, a converter 240 (third converter) and the converter 250 are configured so that a carrier amplifier 220 (third amplifier) side can be regarded as a voltage source by the converter 240 and so that the peaking amplifier 230 side can be regarded as a current source by the converter 250. In other words, the converter 240 and the converter 250 are configured to make an absolute value of an impedance on an output side of a carrier amplifier 220 (output side of the converter 240) smaller than an absolute value of an impedance on an output side of the peaking amplifier 230 (each of peaking amplifiers 230, if more than one peaking amplifier 230 is provided) (output side of the converter 250). In the power amplifier circuit 200, a voltage source and a current source are connected in parallel, and thus a current that flows into a resistor is determined by the voltage source and the current source. Then, a current coming from the voltage source is a current obtained by subtracting a current coming from the current source from the current that flows into the resistor.

Incidentally, the converter 240 is the same as the converter 150 according to the first embodiment, the converter 250 is the same as the converter 140 according to the first embodiment, and thus a description of these converters is omitted.

The power amplifier circuit 200 in which the converter 250 on the peaking amplifier 230 side is removed will be described below with reference to FIG. 8. As illustrated in FIG. 8, the power amplifier circuit 200 performs matching between the impedance $R_L$ of the load 1000 and an output impedance as seen from the peaking amplifier 230 by using a balun 260. The balun 260 includes, for example, a matching-purpose transformer 261, an input-purpose capacitor 262, and an output-purpose capacitor 263.

The matching-purpose transformer 261 is, for example, a winding transformer including an input-side winding 261a and an output-side winding 261b connected to a ground. The matching-purpose transformer 261 propagates a signal input to the input-side winding 261a to the output-side winding 261b. Specifically, in the matching-purpose transformer 261, an amplified signal obtained by combining an amplified signal output from the carrier amplifier 220 and an amplified signal output from the peaking amplifier 230 is input to the input-side winding 261a and is output from the output-side winding 261b after subjection to impedance conversion. The power supply voltage Vcc is supplied to a midpoint g0 of the input-side winding 261a of the matching-purpose transformer 261.

The input-purpose capacitor 262 is connected in parallel with the input-side winding 261a, for example. The output-purpose capacitor 263 is electrically connected directly to the output-side winding 261b, for example. The input-purpose capacitor 262 and the output-purpose capacitor 263 are provided, for example, for impedance matching performed by the matching-purpose transformer 261 in the case where the influence of parasitic inductance of an input-side transformer is taken into account.

Incidentally, the power amplifier circuit 200 may include an element that can perform impedance matching in addition to the balun 260.

In the power amplifier circuit 200, since the converter 250 for the peaking amplifier 230 is removed, the lower limit of about 0.28 of the coupling coefficient $k_{PL}$ described above does not have to be taken into account. Hence, even in design conditions under which it is difficult to implement a transformer having a high coupling coefficient, an appropriate Doherty amplifier can be implemented. Furthermore, in the power amplifier circuit 200, since the converter 250 is removed, the secondary leakage inductance of a transformer 241 of the converter 240 or the primary leakage inductance of the matching-purpose transformer 261 of the balun 260 is caused to absorb capacitance so as to increase output impedances of amplifier elements constituting the peaking amplifier 230. Furthermore, inductances may be connected in parallel at an appropriate portion to absorb capacitance.

Power Amplifier Circuit 300 According to Third Embodiment

Figure 9:
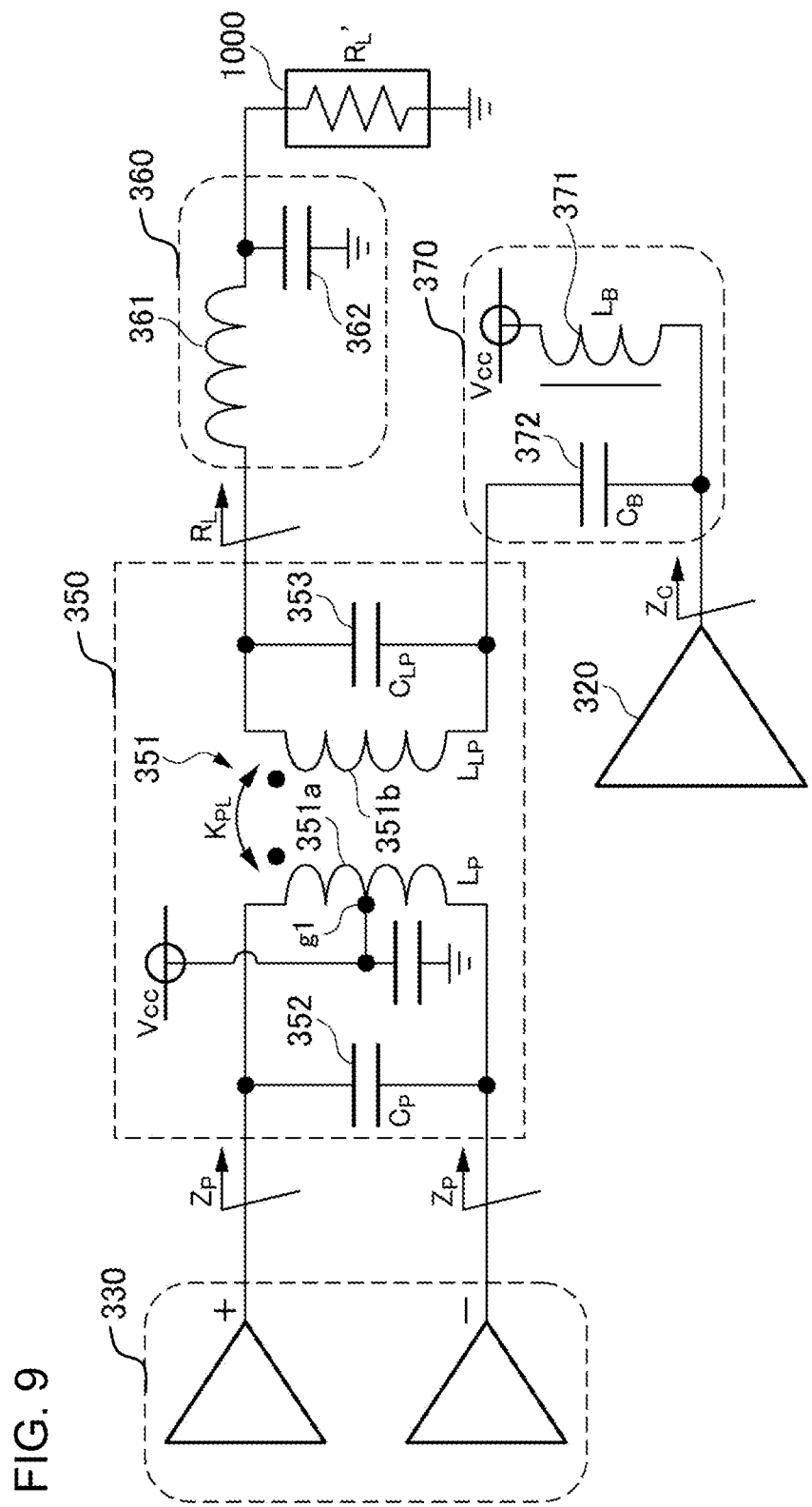
FIG. 9 is a configuration diagram illustrating an example of a configuration of a power amplifier circuit according to a third embodiment.

A power amplifier circuit 300 according to a third embodiment will be described with reference to FIG. 9. FIG. 9 is a configuration diagram illustrating an example of a configuration of the power amplifier circuit 300 according to the third embodiment. In the power amplifier circuit 300 according to the third embodiment, a description of things in common with the above-described embodiments is omitted, and only respects in which the third embodiment differs from the above-described embodiments will be described. In particular, similar function effects achieved by similar configurations are not described one by one.

As illustrated in FIG. 9, in comparison with the power amplifier circuit 100 according to the first embodiment, in the power amplifier circuit 300, a carrier amplifier 320 (fifth amplifier) is configured as a single-ended amplifier, and a converter on a carrier amplifier 320 side (converter corresponding to the converter 140 of the power amplifier circuit 100) is removed.

The power amplifier circuit 300 includes an impedance matching network 360 to perform matching between the impedance $R_L$ of the load 1000 and an impedance on an output side of a peaking amplifier 330 (sixth amplifier). Although FIG. 9 illustrates, as an example of the impedance matching network 360, a single-stage low pass filter composed of an inductor 361 and a capacitor 362, the impedance matching network 360 may be, for example, a multi-stage low pass filter, a high pass filter, a band pass filter obtained by combining a low pass filter and a high pass filter, or a matching network using a transformer and is not limited to a particular filter or network.

Furthermore, the power amplifier circuit 300 includes, at a stage subsequent to the carrier amplifier 320 configured as a single-ended amplifier, a bias circuit 370 that supplies a bias to the carrier amplifier 320. A configuration of the bias circuit 370 is not limited to a particular configuration. In fact, it is desirable that an inductor 371 included in the bias circuit 370 is selected so as to provide susceptance that is the same as the imaginary part of the output admittance of an amplifier element constituting the carrier amplifier 320. This can increase an absolute value of an output impedance of the carrier amplifier 320 and can thus cause the bias circuit 370 to operate like the converter 140.

In comparison with the power amplifier circuit 100 according to the first embodiment, the power amplifier circuit 300 can omit a converter for the carrier amplifier 320 and can thus be reduced in circuit size. Furthermore, the carrier amplifier 320 is configured as a single-ended amplifier, thus facilitating measuring characteristics thereof.

SUMMARY

The power amplifier circuit 100 according to an exemplary embodiment of the present disclosure includes the carrier amplifier 120 (first amplifier) that, in a region where a power level of an input signal RFin (input signal) is not less than a first level, amplifies a signal RFin_a (first signal) split from the input signal and outputs an amplified signal RFamp_a (second signal); the converter 140 (first converter) that is connected to an output side of the carrier amplifier 120 (first amplifier) and converts an impedance on the output side of the carrier amplifier 120 (first amplifier); and at least one or more peaking amplifiers 130 (second amplifiers) that, in a region where the power level of the input signal RFin (input signal) is not less than a second level higher than the first level, amplify a signal RFin_b (third signal) split from the input signal RFin (input signal) and output an amplified signal RFamp_b (fourth signal). Output sides of the respective peaking amplifiers 130 (second amplifiers) are connected in series with an output side of the converter 140 (first converter). The converter 140 (first converter) is configured to make an absolute value of the impedance on the output side of the carrier amplifier 120 (first amplifier) larger than absolute values of impedances on the output sides of the respective peaking amplifiers 130 (second amplifiers). Thus, an appropriate load modulation effect can be produced without necessarily using a quarter-wave line.

Furthermore, the converter 140 (first converter) of the power amplifier circuit 100 according to the exemplary embodiment of the present disclosure includes the first transformer 141 including the input-side winding 141a (first input-side winding) to which the amplified signal RFamp_a (second signal) is input and the output-side winding 141b (first output-side winding) coupled to the input-side winding 141a (first input-side winding) via an electromagnetic field, the first capacitor 142 connected in parallel with the input-side winding 141a (first input-side winding), and the second capacitor 143 connected in series with the output-side winding 141b (first output-side winding). Thus, the converter 140 can be implemented in a simple configuration.

Furthermore, the power amplifier circuit 100 according to the exemplary embodiment of the present disclosure further includes the converters 150 (second converters) that are connected to the output sides of the respective peaking amplifiers 130 (second amplifiers) and convert characteristics regarding the peaking amplifiers 130 (second amplifiers). The output sides of the respective peaking amplifiers 130 (second amplifiers) are connected in series with the output side of the converter 140 (first converter) through the converters 150 (second converters). The converter 140 (first converter) and the converters 150 (second converters) are configured to make an absolute value of the impedance on the output side of the carrier amplifier 120 (first amplifier) larger than absolute values of the impedances on the output sides of the respective peaking amplifiers 130 (second amplifiers). This enables more appropriate impedance matching.

Furthermore, the converters 150 (second converters) of the power amplifier circuit 100 according to the exemplary embodiment of the present disclosure include the second transformer 151 including the input-side winding 151a (second input-side winding) to which the fourth signal is input and the output-side winding 151b (second output-side winding) coupled to the input-side winding 151a (second input-side winding) via an electromagnetic field, the third capacitor 152 connected in parallel with the input-side winding 151a (second input-side winding), and the fourth capacitor 153 connected in parallel with the output-side winding 151b (second output-side winding). Thus, the converters 150 can be implemented in a simple configuration.

Furthermore, the carrier amplifier 120 (first amplifier) of the power amplifier circuit 100 according to the exemplary embodiment of the present disclosure is a differential amplifier. Thus, a circuit can be implemented that is resistant to power supply noise. Furthermore, a simple bias circuit and a circuit exhibiting excellent linearity can be implemented.

Furthermore, each of the peaking amplifiers 130 (second amplifiers) of the power amplifier circuit 100 according to the exemplary embodiment of the present disclosure is a differential amplifier. Thus, a circuit can be implemented that is resistant to power supply noise. Furthermore, a simple bias circuit and a circuit exhibiting excellent linearity can be implemented.

The power amplifier circuit 200 according to an exemplary embodiment of the present disclosure includes the carrier amplifier 220 (third amplifier) that, in a region where a power level of an input signal is not less than a third level, amplifies a signal RFin_a (fifth signal) split from the input signal RFin (input signal) and outputs an amplified signal RFamp_a (sixth signal); the converter 240 (third converter) that is connected to an output side of the carrier amplifier 220 (third amplifier) and converts an impedance on the output side of the carrier amplifier 220 (third amplifier); and at least one or more peaking amplifiers 230 (fourth amplifiers) that, in a region where the power level of the input signal RFin (input signal) is not less than a fourth level higher than the third level, amplify a signal RFin_b (seventh signal) split from the input signal RFin (input signal) and output an amplified signal RFamp_b (eighth signal). Output sides of the respective peaking amplifiers 230 (fourth amplifiers) are connected in parallel with an output side of the converter 240 (third converter). The converter 240 (third converter) is configured to make an absolute value of the impedance on the output side of the carrier amplifier 220 (third amplifier) smaller than absolute values of impedances on the output sides of the respective peaking amplifiers 230 (fourth amplifiers). Thus, an appropriate load modulation effect can be produced without necessarily using a quarter-wave line.

The converter 240 (third converter) of the power amplifier circuit 200 according to the exemplary embodiment of the present disclosure includes the transformer 241 (third transformer) including an input-side winding 241*a* (third input-side winding) to which the amplified signal RFamp_a (sixth signal) is input and an output-side winding 241*b* (third output-side winding) coupled to the input-side winding 241*a* (third input-side winding) via an electromagnetic field, a capacitor 242 (fifth capacitor) connected in parallel with the input-side winding 241*a* (third input-side winding), and a capacitor 243 (sixth capacitor) connected in parallel with the output-side winding 241*b* (third output-side winding). Thus, the converter 240 can be implemented in a simple configuration.

The power amplifier circuit 200 according to the exemplary embodiment of the present disclosure further includes the converters 250 (fourth converters) that are connected to the output sides of the respective peaking amplifiers 230 (fourth amplifiers) and convert characteristics regarding the peaking amplifiers 230 (fourth amplifiers). The respective peaking amplifiers 230 (fourth amplifiers) are connected in parallel with the output side of the converter 240 (third converter) through the converters 250 (fourth converters). The converter 240 (third converter) and the converters 250 (fourth converters) are configured to make an absolute value of the impedance on the output side of the carrier amplifier 220 (third amplifier) smaller than absolute values of the impedances on the output sides of the respective peaking amplifiers 230 (fourth amplifiers). This enables more appropriate impedance matching.

The converters 250 (fourth converters) of the power amplifier circuit 200 according to the exemplary embodiment of the present disclosure include a transformer 251 (fourth transformer) including an input-side winding 251*a* (fourth input-side winding) to which the eighth signal is input and an output-side winding 251*b* (fourth output-side winding) coupled to the input-side winding 251*a* (fourth input-side winding) via an electromagnetic field, a capacitor 252 (seventh capacitor) connected in parallel with the input-side winding 251*a* (fourth input-side winding), and a capacitor 253 (eighth capacitor) connected in series with the output-side winding 251*b* (fourth output-side winding). Thus, the converters 250 can be implemented in a simple configuration.

The carrier amplifier 220 (third amplifier) of the power amplifier circuit 200 according to the exemplary embodiment of the present disclosure is a differential amplifier. Thus, a circuit can be implemented that is resistant to power supply noise. Furthermore, a simple bias circuit and a circuit exhibiting excellent linearity can be implemented.

Each of the peaking amplifiers 230 (fourth amplifiers) of the power amplifier circuit 200 according to the exemplary embodiment of the present disclosure is a differential amplifier. Thus, a circuit can be implemented that is resistant to power supply noise. Furthermore, a simple bias circuit and a circuit exhibiting excellent linearity can be implemented.

The power amplifier circuit 300 according to an exemplary embodiment of the present disclosure includes the carrier amplifier 320 (fifth amplifier) that, in a region where a power level of an input signal is not less than a fifth level, amplifies a signal RFin_a (ninth signal) split from the input signal RFin (input signal) and outputs an amplified signal RFamp_a (tenth signal); at least one or more peaking amplifiers 330 (sixth amplifiers) that, in a region where the power level of the input signal RFin (input signal) is not less than a sixth level higher than the fifth level, amplify a signal RFin_b (eleventh signal) split from the input signal RFin (input signal) and output an amplified signal RFamp_b (twelfth signal); and converters 350 (fifth converters) that are connected to output sides of the respective peaking amplifiers 330 (sixth amplifiers) and convert impedances on the output sides of the respective peaking amplifiers 330 (sixth amplifiers). Output sides of the respective converters 350 (fifth converters) are connected in series with an output side of the carrier amplifier 320 (fifth amplifier). The respective converters 350 (fifth converters) are configured to make an absolute value of an impedance on the output side of the carrier amplifier 320 (fifth amplifier) smaller than absolute values of the impedances on the output sides of the respective peaking amplifiers 330 (sixth amplifiers). Thus, an appropriate load modulation effect can be produced without necessarily using a quarter-wave line.

The converters 350 (fifth converters) of the power amplifier circuit 300 according to the exemplary embodiment of the present disclosure include a transformer 351 (fifth transformer) including an input-side winding 351*a* (fifth input-side winding) to which the amplified signal RFamp_b (twelfth signal) is input and an output-side winding 351*b* (fifth output-side winding) coupled to the input-side winding 351*a* (fifth input-side winding) via an electromagnetic field, a capacitor 352 (ninth capacitor) connected in parallel with the input-side winding 351*a* (fifth input-side winding), and a capacitor 353 (tenth capacitor) connected in parallel with the output-side winding 351b (fifth output-side winding). Thus, the converters 350 can be implemented in a simple configuration.

Each of the peaking amplifiers 330 (sixth amplifiers) of the power amplifier circuit 300 according to the exemplary embodiment of the present disclosure is a differential amplifier. Thus, a circuit can be implemented that is resistant to power supply noise. Furthermore, a simple bias circuit and a circuit exhibiting excellent linearity can be implemented.

The above-described embodiments are intended to facilitate understanding of the present disclosure but are not intended for a limited interpretation of the present disclosure. The present disclosure can be changed or improved without necessarily departing from the gist thereof and also encompasses equivalents thereof. In other words, appropriate design changes made to the embodiments by those skilled in the art are also encompassed in the scope of the present disclosure as long as the changes have features of the present disclosure. The elements included in the embodiments, and the arrangement and so forth of the elements are not limited to those exemplified herein and can be appropriately changed.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
    a first amplifier configured to amplify a first signal in a region where a power level of an input signal is not less than a first level, and to output a second signal, the first signal being split from the input signal;
    a first converter connected to an output side of the first amplifier and configured to convert an impedance on the output side of the first amplifier;
    one or more second amplifiers configured to amplify a third signal in a region where the power level of the input signal is not less than a second level, and to output a fourth signal, the second level being greater than the first level, and the third signal being split from the input signal; and
    one or more second converters connected to output sides of the respective second amplifiers and configured to convert the impedances on the output sides of the respective second amplifiers,
    wherein the output sides of the respective second amplifiers are connected in series with an output side of the first converter through the second converters,
    wherein the first converter comprises:
    a first transformer including a first input-side winding to which the second signal is input and a first output-side winding coupled to the first input-side winding via an electromagnetic field;
    a first capacitor connected in parallel with the first input-side winding; and
    a second capacitor connected in series with the first output-side winding, and
    wherein the second converters comprise:
    a second transformer including a second input-side winding to which the fourth signal is input and a second output-side winding coupled to the second input-side winding via an electromagnetic field;
    a third capacitor connected in parallel with the second input-side winding; and
    a fourth capacitor connected in parallel with the second output-side winding.

2. The power amplifier circuit according to claim 1, wherein the first amplifier is a differential amplifier.

3. The power amplifier circuit according to claim 1, wherein each of the second amplifiers is a differential amplifier.

4. A power amplifier circuit comprising:
    a third amplifier configured to amplify a fifth signal in a region where a power level of an input signal is not less than a third level, and to output a sixth signal, the fifth signal being split from the input signal;
    a third converter connected to an output side of the third amplifier and configured to convert an impedance on the output side of the third amplifier;
    one or more fourth amplifiers configured to amplify a seventh signal in a region where the power level of the input signal is not less than a fourth level, and to output an eighth signal, the fourth level being greater than the third level, and the seventh signal being split from the input signal; and
    one or more fourth converters connected to output sides of the respective fourth amplifiers and configured to convert the impedances on the output sides of the respective fourth amplifiers,
    wherein output sides of the respective fourth amplifiers are connected in parallel with an output side of the third converter through the fourth converters,
    wherein the third converter comprises:
    a third transformer including a third input-side winding to which the sixth signal is input and a third output-side winding coupled to the third input-side winding via an electromagnetic field;
    a fifth capacitor connected in parallel with the third input-side winding; and
    a sixth capacitor connected in parallel with the third output-side winding, and
    wherein the fourth converters comprise:
    a fourth transformer including a fourth input-side winding to which the eighth signal is input and a fourth output-side winding coupled to the fourth input-side winding via an electromagnetic field;
    a seventh capacitor connected in parallel with the fourth input-side winding; and
    an eighth capacitor connected in series with the fourth output-side winding.

5. The power amplifier circuit according to claim 4, wherein the third amplifier is a differential amplifier.

6. The power amplifier circuit according to claim 4, wherein each of the fourth amplifiers is a differential amplifier.

* * * * *